United States Patent [19]

Derkits, Jr.

[11] Patent Number: 4,683,484
[45] Date of Patent: Jul. 28, 1987

[54] LATERAL CONFINEMENT OF CHARGE CARRIERS IN A MULTIPLE QUANTUM WELL STRUCTURE

[75] Inventor: Gustav E. Derkits, Jr., Boro of New Providence, N.J.

[73] Assignee: Bell Communications Research, Inc., Livingston, N.J.

[21] Appl. No.: 768,673

[22] Filed: Aug. 23, 1985

[51] Int. Cl.$^4$ .................. H01L 29/48; H01L 29/205; H01L 29/78; H01L 29/06
[52] U.S. Cl. ............................ 357/16; 357/4; 357/15; 357/24; 357/55; 357/56
[58] Field of Search ............... 357/4, 16, 24, 15

[56] References Cited

U.S. PATENT DOCUMENTS

| | | | |
|---|---|---|---|
| 3,936,322 | 2/1976 | Blum et al. | 148/1.5 |
| 4,032,952 | 6/1977 | Ohba et al. | 357/24 M |
| 4,080,617 | 3/1978 | Dyment | 357/17 |
| 4,115,150 | 9/1978 | Dyment | 148/1.5 |
| 4,163,237 | 7/1979 | Dingle et al. | 357/16 |
| 4,163,238 | 7/1979 | Esaki et al. | 357/17 |
| 4,184,171 | 1/1980 | Panish | 357/18 |
| 4,250,515 | 2/1981 | Esaki et al. | 357/16 |
| 4,386,429 | 5/1983 | Anthony | 372/45 |
| 4,403,397 | 9/1983 | Bottka et al. | 29/572 |
| 4,550,331 | 10/1985 | Milano | 357/24 M |

OTHER PUBLICATIONS

Bradley et al., "Silicon Nitride Layers on Gallium Arsenide by Low-Energy Ion Beam Suppering" J. Vac. Sci. Technol. vol. 16 (Mar./Apr. 79), pp. 189–192.

Vaidyanathan et al., "Study of Encapsulants for Annealing GaAs" J. Electrochem. Soc. vol. 12 (11/77), pp. 1781–1784.

*Primary Examiner*—Gene M. Munson
*Attorney, Agent, or Firm*—James W. Falk

[57] ABSTRACT

Non-invasive structures for laterally confining charge carriers in the narrow bandgap layers of a multiple quantum wall semiconductor device are disclosed. Such structures can be expected to be useful in charge coupled devices.

9 Claims, 12 Drawing Figures

LATERAL CONFINEMENT OF CHARGE CARRIERS IN A MULTIPLE QUANTUM WELL STRUCTURE

FIELD OF THE INVENTION

This invention relates to the lateral confinement of charge carriers in the quantum wells of a multiple quantum well semiconductor structure.

BACKGROUND OF THE INVENTION

A multiple quantum well structure comprises a first plurality of relatively narrow bandgap semiconductor layers and a second plurality of relatively wide bandgap semiconductor layers. The relatively narrow bandgap layers are interleaved with and contiguous with the relatively wide bandgap layers. The wide-bandgap layers should exhibit a conduction and/or valence band step sufficiently large to confine electrons and/or holes respectively to the narrow bandgap layers. In other words, the steps in the conduction and valence bands serve to define quantum wells whose widths are coextensive with the narrow band gap layers. These quantum wells confine the charge carriers to the narrow bandgap layers and tend to inhibit the transverse movement of the charge carriers from one layer to the next.

Preferably, the adjacent wide and narrow bandgap layers are substantially lattice matched so that the heterojunctions formed there between are substantially defect free. The multiple quantum well structure may be formed by alternatingly depositing AlGaAs and GaAs layers on a semi-insulating GaAs substrate. The multiple quantum well structure may also be formed from other III-V compounds such as the InP-InGaAsP or InAs-GaAsSb materials systems.

Multiple quantum well structures have found numerous uses in electronics and optical-electronics. Such devices may be used as infrared radiation sources (see for example, Esaki et al. U.S. Pat. No. 4,163,238); negative resistance devices (see, for example, Esaki et al. U.S. Pat. No. 4,250,515); FET devices (see, for example, Dingle et al. U.S. Pat. No. 4,163,237); and as frequency multipliers (see my patent application, "Multiple Quantum Well Frequency Multiplier Circuit" Ser. No. 768,671, filed on Aug. 23, 1985 and assigned to the assignee hereof). Multiple quantum well devices may also be used as memory devices in which charge is stored and released from the quantum wells. As more fully described in such references, a quantum well, as we use it herein, is a region having a conductor or valence band step of sufficient magnitude to confine carriers to that region.

While quantum wells formed from alternating wide and narrow bandgap layers may be used to confine charge carriers to the narrow bandgap layers and inhibit transverse movement of charge carriers from one layer to the next, in particular semiconductor devices, it may be desirable to laterally confine charge carriers to particular regions of the narrow bandgap layers.

Heretofore, such lateral confinement has been achieved by a variety of techniques. For example, if the alternating wide and narrow bandgap regions are n-type material, then lateral confinement of electrons to particular regions of the narrow bandgap layers may be achieved by diffusing a ring-like zone of p-type dopant through the wide and narrow bandgap layers of the multiple quantum well structure. This would serve to laterally confine the electrons to the region defined by the ringlike p-type zone. Alternatively, lateral confinement of electrons to particular regions may be achieved through barriers formed by way of proton bombardment. Additionally, charge carriers may be laterally confined as result of barriers which are formed by etching away part of the multiple quantum well structure so as to expose the remaining portions of the multiple quantum well structure to the environment.

The aforedescribed techniques for lateral confinement of charge carriers in multiple quantum well structures suffer from two main shortcomings. First, the techniques are invasive. All involve damage to the narrow bandgap layers by means of diffusion of dopants, ion bombardment, or etching, etc. Such damage tends to reduce desired device properties such as charge mobility within the narrow bandgap layers.

In addition, the aforedescribed techniques for lateral charge confinement provide little or no ability to successively confine charge carriers to a particular region within the narrow bandgap layers and then deconfine the charge carriers such as by moving them to other regions within the narrow bandgap layers. The reason for this is that the lateral confinement barriers formed by etching, ion bombardment, or the diffusion of p-type dopants through the narrow bandgap layers are permanent barriers. These permanent barriers cannot be instantaneously formed so as to confine a charge packet to one region and then removed so as to laterally move the charge packet to another region. The ability to successively charge and discharge particular regions of the narrow bandgap layers of a multiple quantum well structure can be expected to be important when multiple quantum well structures are used to implement memory devices or charge coupled arrays.

Accordingly, it is an object of the present invention to provide non-invasive structures for laterally confining charge in a multiple quantum well device. Preferably, the non-invasive structures will result in the formation of non-permanent confining barriers so as to provide the device designers and users with maximal ability to laterally confine charge to particular regions within the narrow bandgap regions and to successively discharge these regions while moving the charge carriers laterally to other regions.

SUMMARY OF THE INVENTION

The present invention is a multiple quantum well semiconductor device which is formed from alternating wide and narrow bandgap semiconductor layers. The steps in the conduction and/or valence band serve to confine electrons and/or holes respectively to the narrow bandgap layers and to inhibit the transverse motion of charge carriers from one layer to the next.

Lateral confinement of the charge carriers to particular regions of the narrow bandgap layers is achieved by the formation of electric fields within the narrow bandgap layers. The electric fields form barriers which serve to confine charge carriers to particular regions of the narrow bandgap layers. These electric field barriers are formed using structural elements which are spaced apart from and located outside the narrow bandgap layers. Thus, lateral confinement is achieved by means of a non-invasive technique which causes no damage to the narrow bandgap layers. Desirable device properties such as lateral charge carrier mobility are not destroyed through the use of the lateral confinement electric field barriers of the present invention.

In addition, by applying appropriate voltage signals to the field producing structural element, the laterally confining electric field barriers may be applied or removed in the discretion of the device user. This enables charge packets to be moved laterally from one region to another within the narrow bandgap layers of the multiple quantum well device. Such multiple quantum well devices may be adapted for use as memory devices or charged coupled devices.

BRIEF DESCRIPTION OF THE DRAWING

For purposes of clarity, the figures have not been drawn to scale.

DETAILED DESCRIPTION

Figure 1:
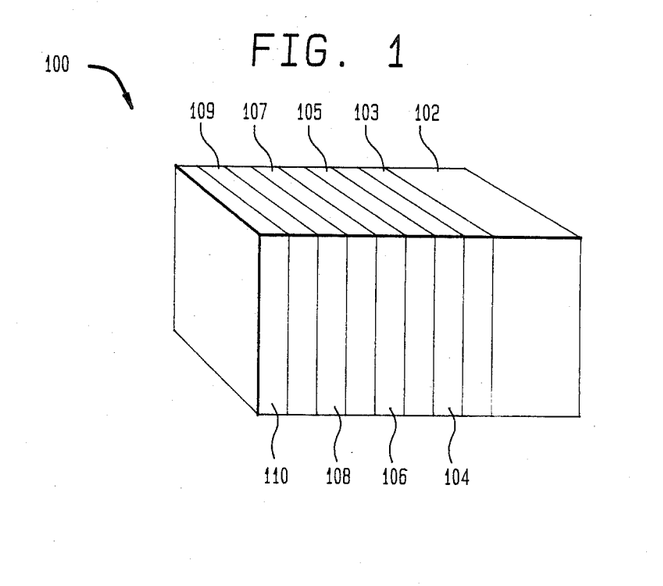
FIG. 1 shows a cross sectional view of a multiple quantum well semiconductor device.

Turning to FIG. 1, a multiple quantum well device 100 implemented in the GaAs-AlGaAs material system is illustrated. The quantum well device 100 illustratively comprises a semi-insulating weakly doped n-type GaAs substrate 102 and thin n-type GaAs layers 104, 106, 108 and 110. Interleaved with and contiguous with the GaAs layers 104, 106, 108 and 110 are layers 103, 105, 107 and 109 which are illustratively formed from $Al_xGa_{1-x}As$ where x ranges from about 0.2 to about 0.35 or greater. Typically, the layers 102 through 110 are deposited on the substrate 102 by a conventional techniques such as molecular beam epitaxy. The layers 102 through 110 are each about 100 angstroms thick and have an n-type dopant concentration of about $10^{17}/cm^3$.

Figure 2:
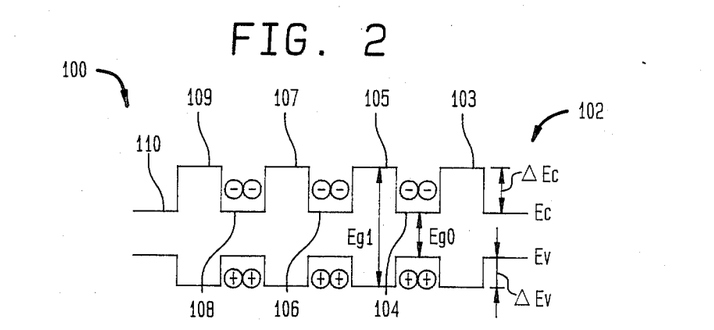
FIG. 2 shows the bandgap diagram of the multiple quantum well semiconductor device of FIG. 1.

The band structure of the multiple quantum well structure 100 is shown in FIG. 2. The conduction band energy is designated $E_c$ and the valence band energy is designated $E_v$. The $Al_xGa_{1-x}As$ layers 103, 105, 107, 109 are the wide bandgap layers, and the GaAs layers 104, 106, 108, 110 are the narrow bandgap layers. The bandgap $E_{g0}$ of GaAs is about 1.42 e.v. and the bandgap $E_{g1}$ of $Al_xGa_{1-x}As$ ranges from 1.8 e.v. when x is about 0.2 to about 2.1 e.v. when x is about 0.35. In FIG. 2. the step in the conduction band is designated $\Delta E_c$ and the step in the valence band is designated $\Delta E_v$. The relationship between the bandgap energies is such that $E_{g1} = E_{g0} + \Delta E_v + \Delta E_c$. When x is about 0.2 then $\Delta E_v$ is about 0.16 e.v. and $\Delta E_c$ is about 0.24 e.v. The band structure of the AlG9As materials system is discussed in Heterostructures Lasers: Part B by H. C. Casey and M. P. Panish, Academic Press N. Y. 1978.

The steps in the valence and conduction bands serve to define quantum wells in both the valence band and the conduction bands. The quantum wells are coextensive with the narrow bandgap layers 104, 106, 108 and serve to confine the charge carriers (i.e., electrons and holes) within the narrow bandgap layers 104, 106, 108 thereby inhibiting transverse movement of charge carriers from one layer to the next. Of course since the structure 100 is n-type, the number of electrons confined in the conduction band wells far exceeds the number of holes confined in the valence band wells.

Figure 3A:
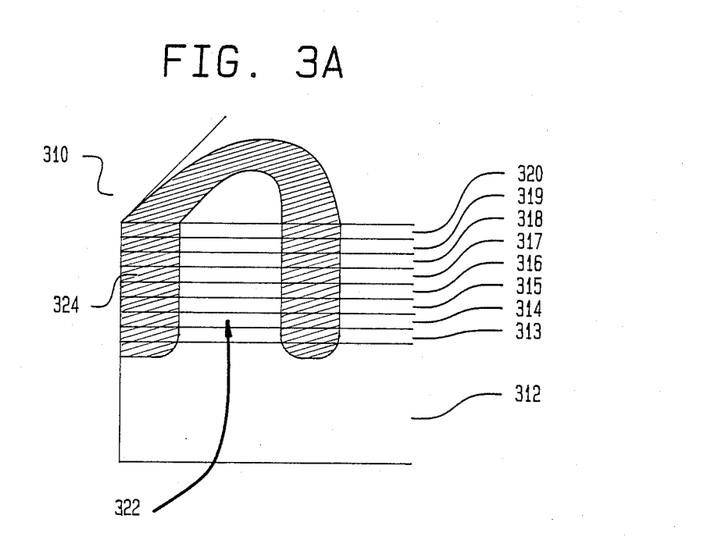
FIGS. 3a, 3b and 3c schematically illustrate, in cross section, prior art techniques for achieving lateral confinement of charge carriers in the narrow bandgap layers of a multiple quantum well semiconductor device.
Figure 3B:
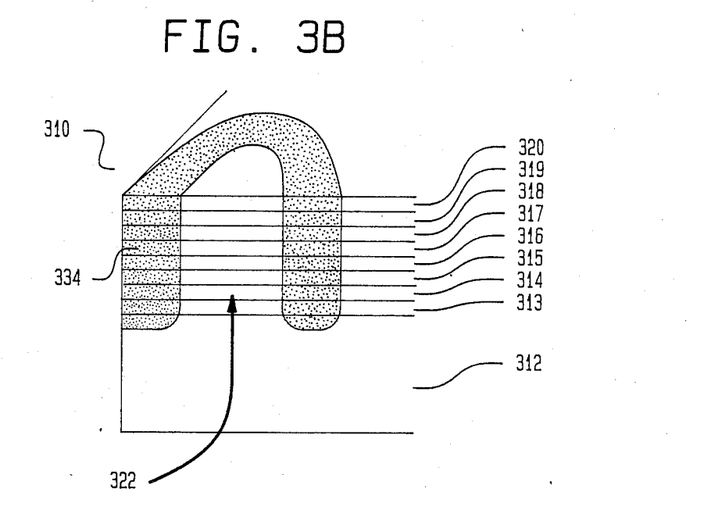
Figure 3C:
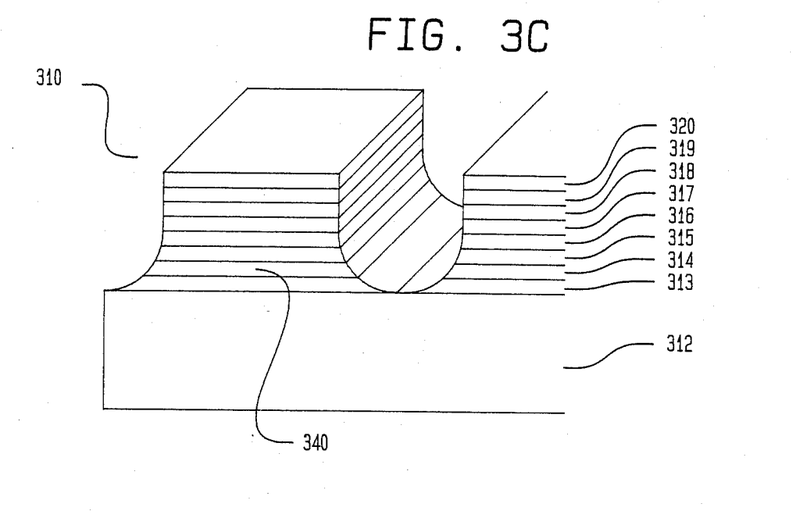

FIGS. 3(a), 3(b), 3(c) illustrate three known ways for laterally confining charge carriers to particular regions within the narrow bandgap layers.

FIG. 3a shows in cross section a portion 310 of a multiple quantum well structure implemented in the GaAs-AlGaAs materials systems, which quantum well structure comprises semi-insulating n-type GaAs substrate 312 and alternating wide and narrow bandgap n-type layers 313 through 320. As discussed above, the charge carriers are transversely confined to the narrow bandgap layers 314, 316, 318 by means of the quantum wells. In the multiple quantum well structure 310 electrons are also laterally confined to region 322, by means of ring-like p-type zone 324. The p-type zone 324 is formed by diffusing p-type dopants into the multiple quantum well structure. The electric field set up at the junction between p-type ring 324 and the n-type layers 313 through 320 tends to prevent the majority carrier electrons from escaping from the region 322.

Instead of using a ring of p-type material to laterally confine electrons in the narrow bandgap layers, a ring of proton bombarded material may be used. As shown in FIG. 3(b) a ring 334 of proton bombarded material is used laterally to confine charge carriers to the region 322 of the multiple quantum well structure 310.

Alternatively, etching may be used to define regions in the multiple quantum well structure 310 in which charge carriers are laterally confined. In FIG. 3(c) charge carriers are laterally confined to a region 340 by way of exposure to the environment. Selected portions of the narrow and wide bandgap layers 313 through 320 are etched away to define the region 340 in which charge carriers are laterally confined.

As discussed above, the lateral confinement techniques illustrated in FIG. 3a, 3b, 3c suffer from two main drawbacks. First, all three of the lateral confinement techniques are invasive i.e., they all involve some damage to the narrow bandgap layers in which the charge carriers are confined. This serves to adversely effect desirable device characteristics such as lateral charge mobility. Second, the lateral confinement barriers produced by the aforementioned techniques are permanent barriers. Such barriers make it virtually impossible to laterally move charge carriers from one region to another.

Figure 4A:
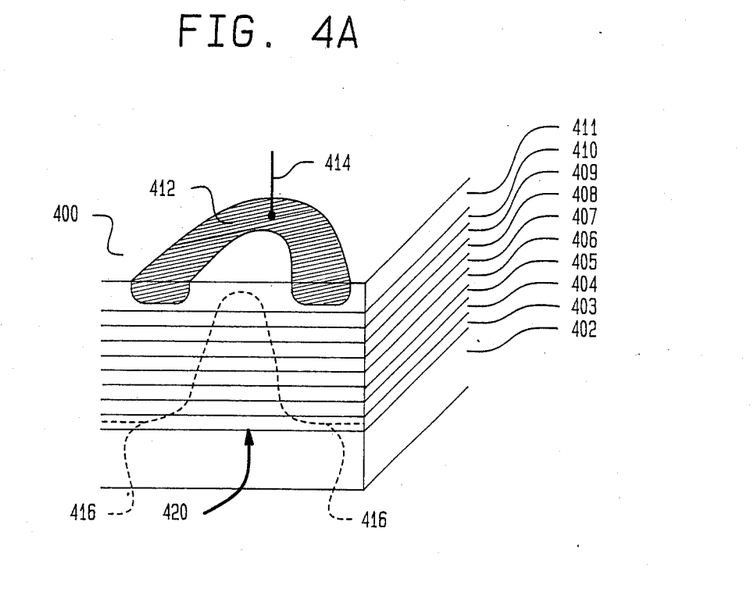
FIGS. 4a, 4b, 4c and 4d schematically illustrate in cross section non-invasive structures for providing lateral confinement of charge carriers in a multiple quantum well device, in accordance with three illustrative embodiments of the present invention.

FIG. 4(a) through 4(d) show four non-invasive structures for laterally confining charge carriers in a multiple quantum well structure. FIG. 4a shows a multiple quantum well structure 400 implemented using the GaAs-AlGaAs materials system. The structure 400 comprises a semi-insulating n-type substrate 402, wide bandgap layers 403, 405, 407, 409 and 411, and narrow bandgap layers 404, 406, 408, and 410. Preferably, the layers 403 through 411 are n-type material. Typically, the layers 403 through 410 are about 100 angstroms thick while the uppermost layer 411 is substantially thicker; about 700 angstroms thick.

A ring of p-type material 412 is diffused into the outermost thick layer 411 of the multiple quantum well structure 400. The p-type ring 412 does not penetrate into the narrow bandgap layers 404, 406, 408, 410. However, depending on the bias voltage applied to the p-type ring 412, by means of contact 414 the electric field 416 formed by the p-n junction between the p-type ring and the n-type layer 411, may extend into and through the narrow bandgap layers 404, 406, 408, 410, so as to laterally confine the charge carriers therein (in this case electrons) to the region 420.

Thus, lateral confinement is achieved without damage to the narrow bandgap layers. In addition, the confining electric field 416 may be removed merely by placing a sufficient forward bias voltage on the p-type ring 412. It is therefore possible to selectively confine charge carriers (mainly electrons in this case) to the region 420 and then deconfine them at the discretion of the device user. The region 420 may also be totally depleted of charge carriers merely by applying a sufficiently large reverse bias voltage to the p-type ring 412.

Figure 4B:
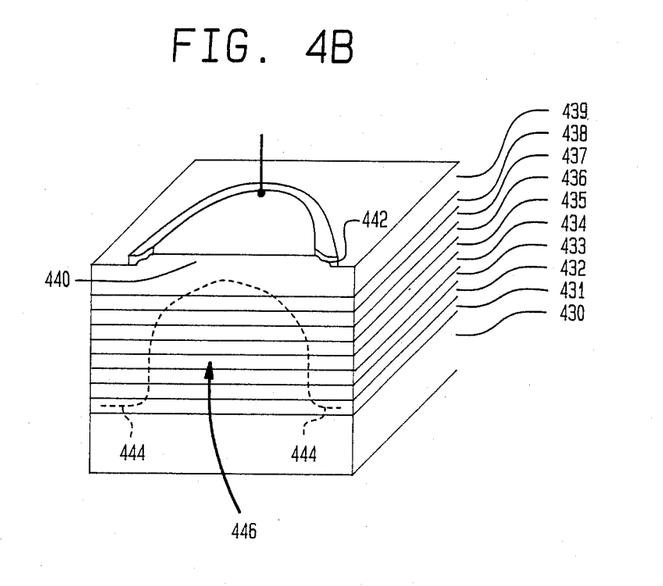

An alternative embodiment of a non-invasive lateral confinement structure is shown in FIG. 4(b). Like the multiple quantum well structure of FIG. 4(a), the multiple quantum well structure of FIG. 4(b) is implemented using the GaAs-AlGaAs materials system. It comprises n-type semi-insulating substrate 430 and alternating n-type wide and narrow bandgap layers 431 through 439. By the use of conventional etching techniques a generally circular mesa 440 is etched in the relatively thick outermost layer 439. A ring 442 of metal such as platinum is deposited on the sidewall of the mesa structure 440. The metal ring forms a Schottky barrier with the n-type layer 439. When appropriately biased, the Schottky barrier results in the formation of an electric field barrier designated by the dotted line 444 which electric field barrier serves to laterally confine majority carriers (i.e., electrons in this case) to the region 446. Note, the electric field barrier 444 may be selectively removed merely by applying a forward bias to the ring 442. On the other hand, the region 446 may be totally depleted of charge carriers by applying a sufficiently large reverse bias to the ring 442.

Figure 4C:
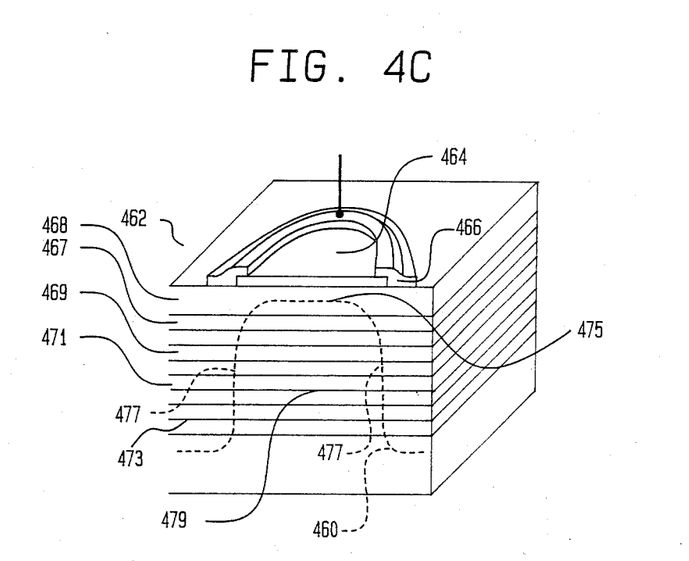

Turning to FIG. 4(c), a noninvasive electric field barrier designated by dotted line 460, is formed in an n-type GaAs-AlGaAs multiple quantum well structure 462 by means of a circular metallic layer 464 and a metallic ring 466 formed at the perimeter of the circular layer 464. The circular metallic layer 464 is formed from a metal such as tungsten having a relatively low Schottky barrier height. The metallic ring 466 is formed from a metal such as platinum, having a relatively high Schottky barrier height.

The electric field portion 475 resulting from the circular layer 464 extends only a short distance into outermost n-type wide bandgap layer 468 while the electric field 477 resulting from the ring 466 extends through the narrow bandgap layers 467, 469, 471, 473 to form a lateral confinement barrier for the charge carriers in the narrow bandgap layers. The lateral confinement barrier may be removed by applying a forward bias voltage to the metallic ring 466. Thus, charge carriers may be selectively confined to and deconfined from the region 479 merely by adjusting the bias on the metal ring 466.

Figure 4D:
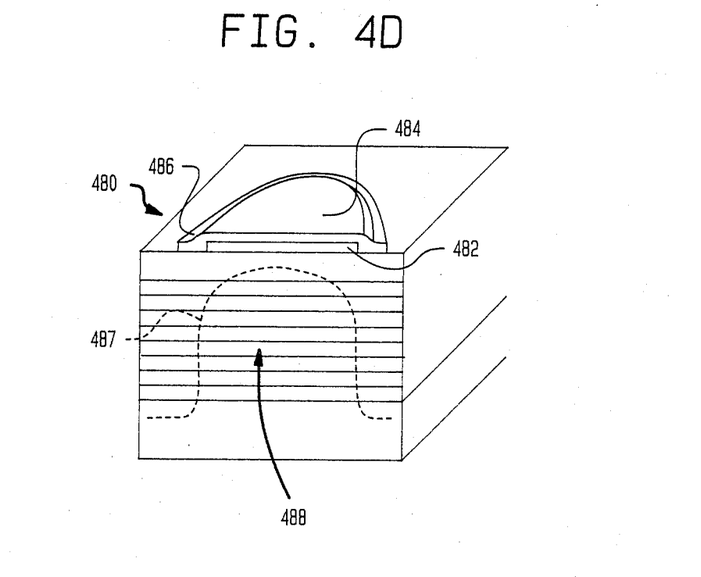

FIG. 4(d) shows a n-type GaAs-AlGaAs multiple quantum well structure 480 in which lateral confinement of the charge carriers is achieved by means of a generally circular dielectric layer 482 and a metallic overlay 484. The metallic overlay extends beyond the perimeter of the circular dielectric layer 482. The portion 486 of the metallic overlay 484 which extends beyond the perimeter of the dielectric layer forms a Schottky barrier with the n-type semiconductor material. This Schottky barrier results in the formation of an electric field designated by dotted line 487 which extends through the narrow bandgap layers comprising the multiple quantum well structure 480. This electric field serves to laterally confine charge carrier to the region 488. The barrier field 487 may be removed by applying a forward bias to the metallic overlay 484. Alternatively, the region 498 may be depleted of charge carriers by applying a sufficiently large reverse bias voltage to the metallic overlay 488.

Figure 5A:
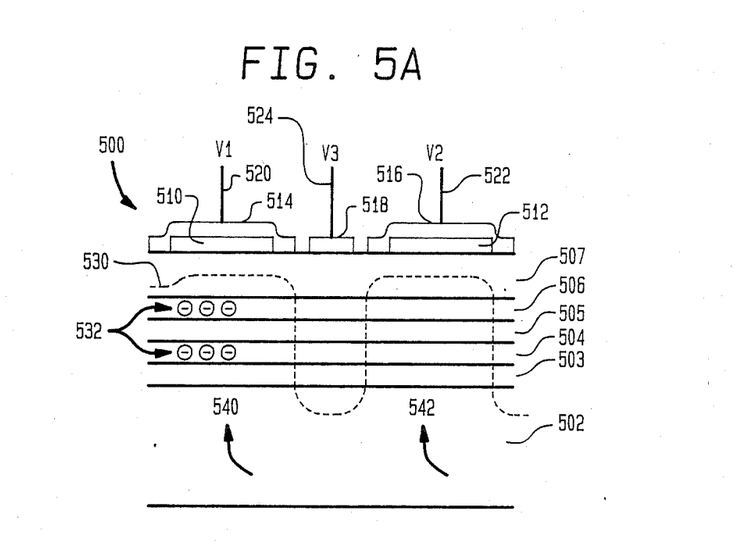
FIGS. 5a, 5b and 5c show a charge coupled device in accordance with an illustrative embodiment of the present invention.
Figure 5B:
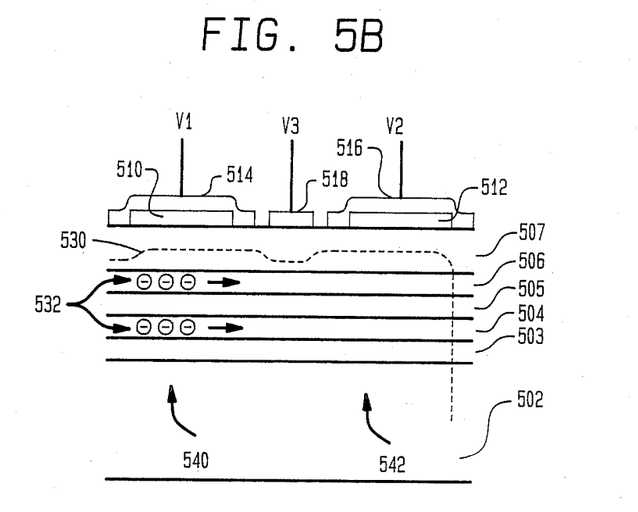
Figure 5C:
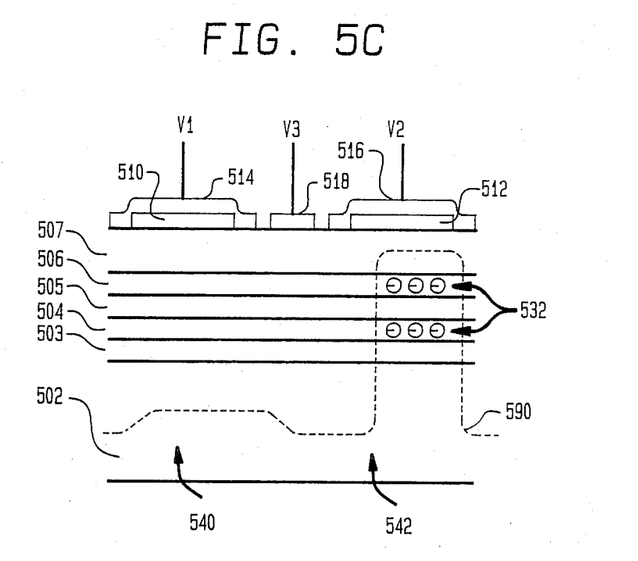

The lateral confinement structures illustrated in FIGS. 4(a)-4(d) all provide for lateral confinement of charge carriers to particular regions of the narrow bandgap layers of a multiple quantum well structure. Such structures are particularly useful for implementing charge coupled devices. Turning to FIGS. 5(a)-5(c), a charge coupled device 500 is illustrated. The charge coupled device 500 utilizes the lateral confinement structures discussed above. Illustratively, the charge coupled device 500 comprises an n-type semi-insulating GaAs substrate 502, n-type GaAs narrow bandgap layers 504, 506, and n-type wide bandgap AlGaAs layers 503, 505, 507. Typically, the layers 503 through 506 are about 100 angstroms thick and the outermost layers 507 is about 700 angstroms thick. The thickness of the outermost layer 507 may vary depending on the spacing of the quantum wells and the doping level. As discussed heretofore, the charge carriers (mainly electrons in this case) are transversely confined to the narrow bandgap layers by means of the steps in the valence and conduction bands.

The charge coupled device 500 also includes dielectric regions 510 and 512 which are formed on the outermost semiconductor layer 507 by conventional techniques known to those skilled in the art.

Metallic overlays 514 and 516 are deposited on top of the dielectric regions 510 and 512 respectively. The metallic overlays 514, 516 extend beyond the perimeters of the dielectric regions 510, 512. A metallic electrode 518 is deposited on the layer 507 in between the metallic overlays 514, 516. Appropriate bias voltages $V_1, V_2, V_3$ may be applied to the metallic overlays 514, 516 and the metal electrode 518 by means of contact leads 520, 522, and 524 respectively.

Operation of the device may be understood as follows: We start with an initial configuration in which $V_1$ is positive, $V_2$ is negative or zero, and $V_3$ is positive, negative or zero. In FIG. 5(a), the curve 530 represents the electric field barriers formed when $V_1$ is positive, $V_2$ is zero and $V_3$ is zero. Above the curve 530, the semiconductor material is depleted as a result of Schottky barriers formed between the metallic layers 514, 516, 518 and the semiconductor material. Charges 532 are injected into the narrow bandgap layers 504, 506 by a known charge injecting means which illustratively is located to the left of the structure 500 shown in FIG. 5. Because of the electric field barrier 530, the charges are laterally confined to the well-shaped region 540 and are blocked from the region designated 542.

In order to move the charge 532 from the well-shaped region 540 to the well-shaped region 542, the voltage $V_1$, $V_2$ and $V_3$ are changed so that $V_1$ remains positive, $V_2$ remains at zero, $V_3$ is positive. With $V_1$, $V_2$ and $V_3$ so chosen the electric field barrier 530 is arranged as shown in FIG. 5(b). In particular, the electric field produced by the electrode 518, which blocked the charges in region 540 from moving to region 542 has been removed. Thus, the charges 532 are able to move laterally from region 540 to region 542.

In order to keep the charges 532 confined to the region 542, the potentials $V_1, V_2, V_3$ are now arranged so that $V_1$ is negative, $V_2$ is approximates zero, and $V_3$ is zero or negative. The electric field barrier resulting from this choice of potentials is shown in FIG. 5(c) by the dotted line 590. The semiconductor regions above the line 590 are depleted of charge carriers. The charge carriers 532 are now laterally confined to the region 542 and region 540 is depleted of charge carriers.

Thus, the charge 532 has been laterally moved from one region to another region in a multiple quantum well semiconductor structure, through the use of noninvasive, non-permanent laterally confining electric field barriers. Such structures are expected to be useful in charge coupled devices.

It should be noted that in some devices, it may be useful to use a combination of invasive and non-invasive techniques to laterally confine change carriers to a particular region of the narrow bandgap layers of a multiple quantum well device. Part of the perimeter of the confinement region may be defined by an invasive technique such as exposure to the environment through use of an etching step. The remainder of the perimeter may be defined by a non-invasive electric field barrier of the type disclosed herein. Illustratively a charge coupled device may comprise a fully etched mesa with non-invasive lateral confinement structures being used to divide the mesa into individual storage cells. The walls of the fully etched mesa may serve to define Dne or more sides of each storage cell.

Finally, the above described embodiments of the invention are intended to be illustrative only. Numerous alternative embodiments of the invention may be devised by those skilled in the art, without departing from the spirit and scope of the following claims.

What is claimed is:

1. A semiconductor device comprising
   a semiconductor body of first conductivity type having at least one relatively narrow bandgap layer and two relatively wide bandgap layers, said relatively narrow bandgap layer being sandwiched between and contiguous with said relatively wide bandgap layers and defining a quantum well; and
   a ring-like zone of a second conductivity type formed within said semiconductor body and spaced apart from said narrow bandgap layer for generating an electric field barrier within said narrow bandgap layer, said electric field barrier defining a region of said narrow bandgap layer in which charge carriers are laterally confined.

2. The semiconductor device of claim 1 wherein said semiconductor body comprises a plurality of narrow bandgap layers each of which is sandwiched between and contiguous with a pair of relatively wide bandgap semiconductor layers.

3. The device of claim 2 further including means for applying a bias voltage to said ring-like zone.

4. The semiconductor device of claim 3 wherein said semiconductor body comprises n-type material and said ring-like zone comprises p-type material.

5. A semiconductor device comprising
   a semiconductor body having at least one relatively narrow bandgap layer and two relatively wide bandgap layers, said relatively narrow bandgap layer being sandwiched between and contiguous with said relatively wide bandgap layers and defining a quantum well in said narrow bandgap layer; and
   electric field producing means spaced apart from said narrow bandgap layer for generating an electric field barrier within said narrow bandgap layer and including a mesa formed integrally with said semiconductor body and a metallic layer formed about the perimeter of said mesa, said metallic layer forming a Schottky barrier for confining charge carriers to a region of said narrow bandgap layer generally underneath said mesa, said electric field barrier defining a particular region of said narrow bandgap layer in which charge carriers are laterally confined.

6. The semiconductor device of claim 5 wherein said semiconductor body comprises a plurality of narrow bandgap layers each of which is sandwiched between and contiguous with a pair of relatively wide bandgap semiconductor layers.

7. The semiconductor device of claim 5, wherein said semiconductor device includes means for applying a bias voltage to said metal ring, said barrier being removable when a forward bias is applied to said ring.

8. A semiconductor device comprising
   a semiconductor body of first conductivity type having at least one relatively narrow bandgap layer and two relatively wide bandgap layers, said relatively narrow bandgap layer being sandwiched between and contiguous with said relatively wide bandgap layers and defining a quantum well in said narrow bandgap layer;
   a first metallic region formed on said semiconductor body, said metallic region comprising a first metal having a relatively low Schottky barrier height; and
   a second metallic region formed about the perimeter of said first metallic region, said second metallic region being formed from a metal having a relatively high Schottky barrier height, said second metallic region being capable of forming an electric field barrier which confines charge carriers to a region of the narrow bandgap layer generally underneath said first metallic region.

9. The semiconductor device of claim 8 wherein said device further includes a means for applying a bias voltage to said second metallic region, said electric field barrier being capable of removal when a forward bias is applied to said second metallic region.

* * * * *

UNITED STATES PATENT AND TRADEMARK OFFICE
CERTIFICATE OF CORRECTION

PATENT NO. : 4,683,484
DATED : July 28, 1987
INVENTOR(S) : Gustav E. Derkits, Jr.

It is certified that error appears in the above-identified patent and that said Letters Patent is hereby corrected as shown below:

Column 1, line 50, "conductor" should read -- conduction --.

Signed and Sealed this

Thirtieth Day of August, 1988

Attest:

DONALD J. QUIGG

Attesting Officer

Commissioner of Patents and Trademarks